US007296416B2

(12) United States Patent
Akei et al.

(10) Patent No.: US 7,296,416 B2
(45) Date of Patent: Nov. 20, 2007

(54) VAPOR COMPRESSION CIRCUIT AND METHOD INCLUDING A THERMOELECTRIC DEVICE

(75) Inventors: Masao Akei, Miamisburg, OH (US); Kirill M Ignatiev, Sidney, OH (US); Nagaraj Jayanth, Sidney, OH (US); Hung M Pham, Dayton, OH (US); Jean-Luc M Caillat, Dayton, OH (US)

(73) Assignee: Emerson Climate Technologies, Inc., Sidney, OH (US)

( * ) Notice: Subject to any disclaimer, the term of this patent is extended or adjusted under 35 U.S.C. 154(b) by 0 days.

(21) Appl. No.: 11/342,929

(22) Filed: Jan. 30, 2006

(65) Prior Publication Data

US 2007/0101738 A1    May 10, 2007

Related U.S. Application Data

(63) Continuation of application No. 11/270,879, filed on Nov. 9, 2005.

(51) Int. Cl.
F25D 21/02 (2006.01)
F25B 27/00 (2006.01)

(52) U.S. Cl. ........................................ 62/3.2; 62/238.6
(58) Field of Classification Search ............... 62/238.6, 62/3.2, 3.1, 3.3, 3.7, 324.6; 136/201, 224
See application file for complete search history.

(56) References Cited

U.S. PATENT DOCUMENTS

| | | |
|---|---|---|
| 5,398,510 A | 3/1995 | Gilley et al. |
| 5,605,047 A | 2/1997 | Park et al. |
| 5,636,520 A | 6/1997 | Spauschus et al. |
| 5,705,434 A * | 1/1998 | Imanishi et al. .............. 438/55 |
| 5,887,441 A | 3/1999 | Spauschus et al. |
| 6,161,388 A | 12/2000 | Ghoshal |
| 6,258,215 B1 | 7/2001 | Samsonov et al. |
| 6,271,459 B1 * | 8/2001 | Yoo .......................... 136/201 |
| 6,272,873 B1 | 8/2001 | Bass |
| 6,282,907 B1 * | 9/2001 | Ghoshal ....................... 62/3.7 |
| 6,308,519 B1 | 10/2001 | Bielinski |
| 6,324,860 B1 | 12/2001 | Maeda et al. |
| 6,351,950 B1 | 3/2002 | Duncan |
| 6,401,462 B1 | 6/2002 | Bielinski |
| 6,458,319 B1 * | 10/2002 | Caillat et al. ............... 420/576 |
| 6,490,874 B2 | 12/2002 | Chu et al. |
| 6,494,048 B1 * | 12/2002 | Ghoshal et al. ............... 62/3.7 |
| 6,563,039 B2 * | 5/2003 | Caillat et al. ............... 136/205 |
| 6,613,602 B2 * | 9/2003 | Cooper et al. ................ 438/54 |
| 6,712,258 B2 * | 3/2004 | Ghoshal ..................... 228/134 |
| 6,740,600 B2 * | 5/2004 | Ghoshal .................... 438/754 |
| 6,845,622 B2 | 1/2005 | Sauciuc et al. |
| 6,857,269 B2 * | 2/2005 | Baker ......................... 60/653 |

(Continued)

FOREIGN PATENT DOCUMENTS

EP        0 949 461 A2     10/1999

(Continued)

Primary Examiner—Mohammad M. Ali
(74) Attorney, Agent, or Firm—Harness, Dickey & Pierce, P.L.C.

(57) ABSTRACT

A system and method includes a vapor compression circuit having a source of waste heat. A thermoelectric device is positioned in heat-transfer relation to the source of waste heat and generates an electric current that powers a load.

31 Claims, 9 Drawing Sheets

U.S. PATENT DOCUMENTS 6,941,761 B2 * 9/2005 Gatecliff et al. ............... 62/3.3
2004/0134200 A1 * 7/2004 Schroeder et al. ............ 62/3.7

FOREIGN PATENT DOCUMENTS

| JP | 62-169981 A | | 7/1987 |
| JP | 62-182562 A | | 8/1987 |
| JP | 2000-304396 A | | 11/2000 |
| JP | 2005-61260 A | * | 3/2005 |
| KR | 10-2000-0010150 A | | 2/2000 |
| KR | 2003052895 A | * | 6/2003 |

* cited by examiner

VAPOR COMPRESSION CIRCUIT AND METHOD INCLUDING A THERMOELECTRIC DEVICE

CROSS-REFERENCE TO RELATED APPLICATIONS

This application is a continuation of U.S. patent application Ser. No. 11/270,879 filed on Nov. 9, 2005. The disclosure of the above application is incorporated herein by reference.

FIELD

The present teachings relate to vapor compression circuits, and more particularly to a vapor compression circuit associated with a thermoelectric device.

BACKGROUND

Refrigeration systems incorporating a vapor-compression cycle may be utilized to condition the environment of open or closed compartments or spaces. The vapor-compression cycle utilizes a compressor to compress a phase-changing working fluid (e.g., a refrigerant), which is then condensed, expanded and evaporated. Compressing the working fluid generates heat, which, in cooling applications, is waste heat that is discharged to ambient from the compressor and condenser. Because the waste heat is not used or recovered, the lost energy of the waste heat represents an inefficiency of most refrigeration systems.

In heating applications, such as in a heat pump system, heat stored in the compressed working fluid is extracted through the condenser to heat a space or compartment. Because efficiency of the heat pump system decreases with ambient temperature, heating may be supplemented at low ambient temperatures by a radiant electrical heat source. Radiant electrical heat sources, however, are typically inefficient and, thus, lower the overall efficiency of the heating application.

In some cooling applications, an air flow may be chilled to a very low temperature to reduce the humidity. The low temperature required to remove humidity, however, may be too low for the conditioned space or compartment within a space or compartment to be. In these cases, the dehumidified chilled air may be reheated by electric radiant heat or hot-gas bypass heat to an appropriate temperature while maintaining the low humidity level. Use of radiant electrical heat and a hot gas bypass heat to reheat over-chilled air represents inefficiencies in this type of cooling application.

SUMMARY

A vapor-compression cycle or circuit may be used to meet the temperature or load demands for conditioning one or more spaces or compartments. Waste heat generated by components of the vapor-compression circuit may be used to generate an electric current that may power other components of the vapor-compression circuit. A thermoelectric device may be placed in heat-transferring relation with the generated waste heat and produce the electrical current, which may be used to generate an electric current to power another device or another thermoelectric device. The other devices may include sensors, switches, controllers, fans, valves, actuators, pumps, compressors, etc. The other thermoelectric device may provide cooling or heating of a fluid in heat-transferring relation therewith to supplement the vapor-compression circuit and facilitate the conditioning of the space or compartment. The utilization of the generated waste heat as an energy source for powering other components or loads may improve the efficiency of the system.

The present teachings disclose a method of operating a refrigeration system including transferring heat generated in the system through a thermoelectric device, generating an electric current with the heat flowing through the thermoelectric device, and powering a load with the generated electric current. The load may be another device or another thermoelectric device.

A refrigeration system may be operated by supplying power to a thermoelectric device in a heat-transferring relation with a working fluid flowing through a vapor-compression circuit downstream of a condenser. A first heat flow may be generated with the thermoelectric device. The first heat flow may be transferred to a first fluid medium. A second heat flow may be transferred from the first fluid medium to a second fluid medium.

Further areas of applicability of the present teachings will become apparent from the detailed description provided hereinafter. It should be understood that the detailed description and specific examples are intended for purposes of illustration only and are not intended to limit the scope of the teachings.

BRIEF DESCRIPTION OF THE DRAWINGS

The present teachings will become more fully understood from the detailed description and the accompanying drawings, wherein.

DETAILED DESCRIPTION

The following description is merely exemplary in nature and is in no way intended to limit the teachings, their application, or uses. In describing the various teachings herein, reference indicia are used. Like reference indicia are used for like elements. For example, if an element is identified as 10 in one of the teachings, a like element in subsequent teachings may be identified as 110, 210, etc., or as 10', 10", 10''', etc. As used herein, the term "heat-transferring relation" refers to a relationship that allows heat to be transferred from one medium to another medium and includes convection, conduction and radiant heat transfer.

Thermoelectric elements or devices are solid-state devices that convert electrical energy into a temperature gradient, known as the "Peltier effect," or convert thermal energy from a temperature gradient into electrical energy, known as the "Seebeck effect." With no moving parts, thermoelectric devices are rugged, reliable and quiet.

In use, power is applied from a battery or other DC source to the thermoelectric device, which will have a relatively lower temperature on one side, a relatively higher temperature on the other side, and a temperature gradient therebetween. The lower and higher relative temperature sides are referred herein as a "cold side" and "hot side," respectively. Further, the terms "cold side" and "hot side" may refer to specific sides, surfaces or areas of the thermoelectric devices.

In one application, the hot and cold sides of the thermoelectric device may be placed in heat-transferring relation with two mediums. When power is applied to the thermoelectric device, the resulting temperature gradient will promote heat flow between the two mediums through the thermoelectric device. In another application, one side of the thermoelectric device may be placed in heat-transferring relation with a relatively higher temperature medium providing a heat source and the other side placed in heat-transferring relation with a relatively lower temperature medium providing a heat sink, whereby the resulting hot and cold sides generate electric current. As used herein, the term "heat transfer medium" may be a solid, a liquid or a gas through which heat may be transferred to from. Thermoelectric devices can be acquired from various suppliers. For example, Kryotherm USA of Carson City, Nev. is a source for thermoelectric devices.

One or more thermoelectric devices may generate electric current from waste heat generated in a vapor-compression circuit using the "Seebeck effect." The electric current generated may be used to power other electrical devices or other thermoelectric devices, which may generate a temperature gradient using the "Peltier effect" to transfer heat therethrough. A power supply may be used to supply a current flow to a thermoelectric device to provide a desired temperature gradient thereacross through the "Peltier effect" and transfer heat therethrough to a desired medium.

Figure 1:
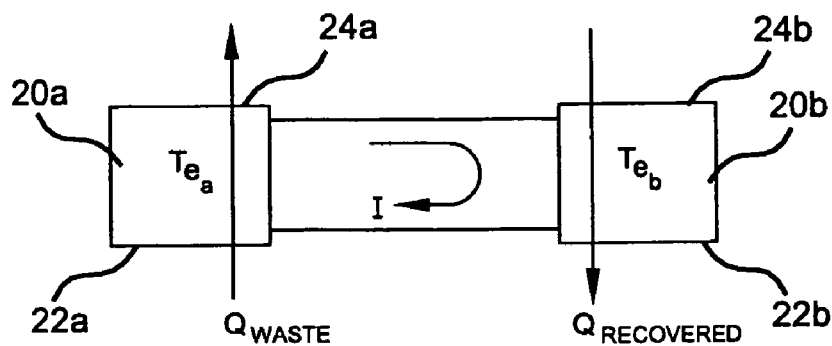
FIGS. 1-3 are schematic diagrams of the use of thermoelectric devices according to the present teachings.

In FIG. 1, a first thermoelectric device 20$a$ uses waste or excess heat $Q_{waste}$ to generate an electric current I that is used to form a temperature gradient across a second thermoelectric device 20$b$ to produce recovered heat $Q_{recovered}$. Hot side 22$a$ of thermoelectric device 20$a$ is in heat-transferring relation to a source of waste heat $Q_{waste}$. Cold side 24$a$ of thermoelectric device 20$a$ is in heat-transferring relation to a heat sink that $Q_{waste}$ can be expelled thereto.

The temperature gradient formed across first thermoelectric device 20$a$ generates an electric current I that is supplied to a second thermoelectric device 20$b$. The electric current flowing therethrough generates a temperature gradient across second thermoelectric device 20$b$ resulting in a hot side 22$b$ and a cold side 24$b$. The temperature gradient causes a recovered heat $Q_{recovered}$ to flow through thermoelectric device 20$b$. Hot side 22$b$ of second thermoelectric device 20$b$ is in heat-transferring relation with a medium into which recovered heat $Q_{recovered}$ is conducted, while cold side 24$b$ of second thermoelectric device 20$b$ is in heat-transferring relation to a heat source. Thus, in FIG. 1 a first thermoelectric device 20$a$ is exposed to waste heat $Q_{waste}$ to cause a second thermoelectric device 20$b$ to generate recovered heat $Q_{recovered}$.

Figure 2:
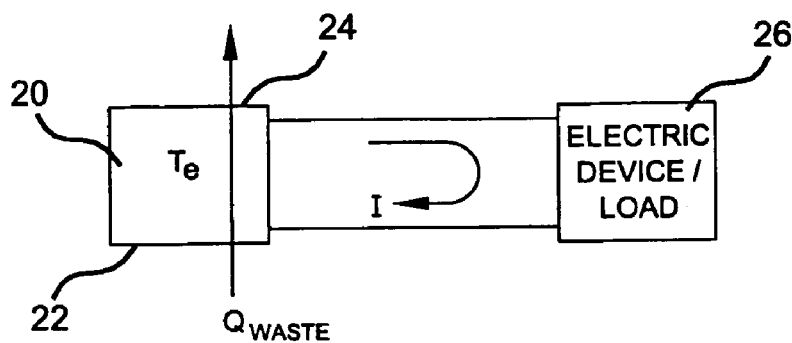

The electric current generated by a thermoelectric device 20 may also be used to activate or drive an electrical device or meet an electrical load (hereinafter referred to as load 26 and/or "L") as shown in FIG. 2. Again, waste heat $Q_{waste}$ is utilized to generate a temperature differential between hot and cold sides 22, 24 and generate electric current I. Thus, in FIG. 2, thermoelectric device 20 is placed in heat-transferring relation to a source of waste heat $Q_{waste}$ and a heat sink to generate electric current I that is used to power load 26. Load 26 is utilized generically herein to refer to any type of device requiring an electric current. Such devices, by way of non-limiting example, include compressors, pumps, fans, valves, solenoids, actuators, sensors, controllers and other components of a refrigeration system. The sensors may include, such as by way of non-limiting example, pressure sensors, temperature sensors, flow sensors, accelerometers, RPM sensors, position sensors, resistance sensors, and the like and may be represented by "S" in the drawings. The various valves, solenoids and actuators may be represented by "V" in the drawings.

Figure 3:
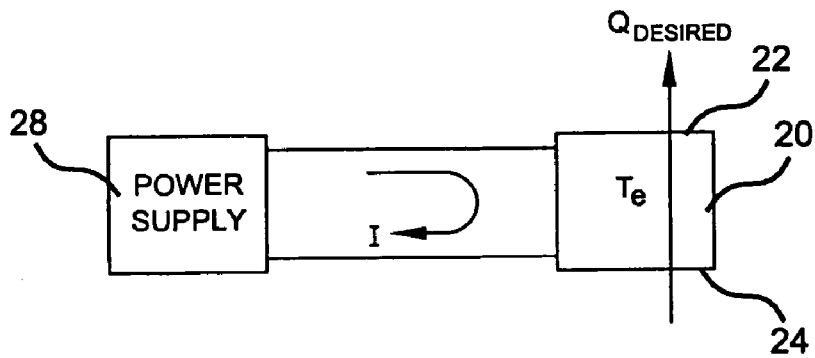

Referring now to FIG. 3, a power supply 28 is connected to a thermoelectric device 20 to generate a desired heat $Q_{desired}$. Power supply 28 may supply a current flow I to thermoelectric device 20 to cause a temperature gradient to be formed between hot and cold sides 22, 24. The temperature gradient generates a desired heat $Q_{desired}$. Hot side 22 may be placed in heat-transferring relation with a medium into which heat $Q_{desired}$ is conducted. Power supply 28 may modulate current flow I to maintain a desired temperature gradient and produce a desired heat $Q_{desired}$. Thus, in FIG. 3, a power supply 28 provides an electric current I within thermoelectric device 20, which generates a source of desired heat $Q_{desired}$.

Figure 4:
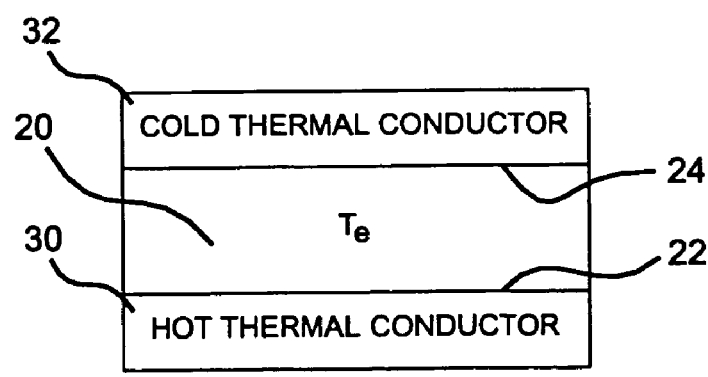
FIG. 4 is a schematic diagram of a thermoelectric device according to the present teachings.

Thermal enhancing devices or thermal conductors 30, 32 may be placed in heat-transferring relation with sides 22, 24 of one or more thermoelectric devices 20 to enhance or facilitate heat transfer through the thermoelectric device 20 and a medium, as shown in FIG. 4. A thermoelectric device 20 having one or more thermal conductors 30, 32 is referred to herein as a thermoelectric module (TEM) 33, which may include multiple thermoelectric devices 20. Thermal conductors 30, 32 may be referred to herein as hot and cold thermal conductors 30, 32, respectively. It should be appreciated, that the terms "hot" and "cold" are relative terms and serve to indicate that that particular thermal conductor is in heat-transferring relation with the respective hot or cold side of a thermoelectric device 20.

Heat transfer may be enhanced by increasing the heat-conductive surface area that is in contact with the medium into which the heat is to be conducted. For example, micro-channel tubing may accomplish the enhancing of the heat flow. The fluid medium flows through the micro channels therein and the hot or cold side of the thermoelectric device is placed in heat-transferring contact with the exterior surface of the tubing. When the medium is a gas, such as air, the thermal conductor may be in the form of fins which may accomplish the enhancement of the heat transfer to/from the medium.

To enhance heat transfer, the thermal conductor may be shaped to match a contour of a heat source. For example, when it is desired to place a thermoelectric device in heat-transferring relation with a curved surface, the thermal conductor may have one surface curved so that it is complementary to the surface of the solid through which the heat is to be conducted while the other side of the thermal conductor is complementary to the hot or cold side of the thermoelectric device 20.

Enhanced heat transfer may be accomplished through heat-conducting materials, layers or coatings on the thermoelectric device 20. Thermal conductors 30, 32 may include materials, layers or coatings having a high thermal conductivity whereby heat transfer through the thermoelectric device 20 is conducted efficiently. By way of non-limiting example, materials having a high thermal conductivity include aluminum, copper and steel. Moreover, heat-conducting adhesives may also be used as thermal conductors 30, 32. Regardless of the form, the thermal conductors 30, 32 have a high thermal conductivity.

In a vapor-compression cycle or circuit, a compressor 34 compresses a relatively cool working fluid (e.g., refrigerant) in gaseous form to a relatively high temperature, high-pressure gas. The compressing process generates waste heat $Q_{waste}$ that is conducted through the compressor to ambient. Waste heat $Q_{waste}$ may be utilized by a thermoelectric device 20 to power another thermoelectric device 20, and/or a load 26.

Figure 5:
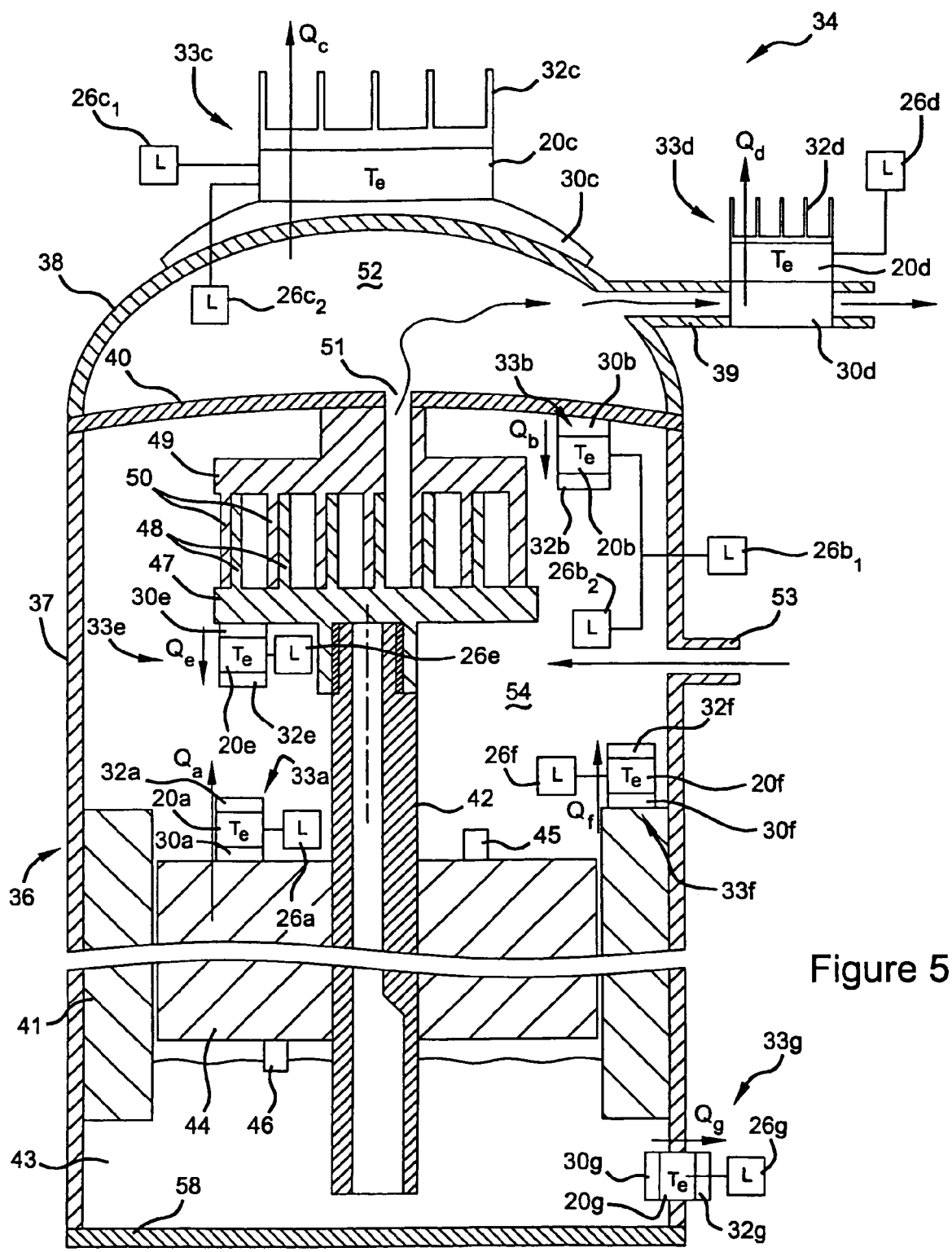
FIG. 5 is a schematic diagram of a compressor with thermoelectric devices according to the present teachings.

Referring to FIG. 5, a schematic view of portions of an exemplary compressor, in this case an orbital scroll compressor 34 by way of a non-limiting example, generally includes a cylindrical hermetic shell 37 having welded at the upper end thereof a cap 38 and at the lower end thereof a base 58. A refrigerant discharge passage 39, which may have a discharge valve (not shown) therein, is attached to cap 38. Other major elements affixed to shell 37 include a transversely extending partition 40 that is welded about its periphery at the same point that cap 38 is welded to shell 37, upper and lower bearing assemblies (not shown) and a motor stator 41 press-fitted therein. A driveshaft or crankshaft 42 is rotatably journalled in the upper and lower bearing assemblies. The lower portion of shell 37 forms a sump 43 that is filled with lubricating oil which gets internally distributed throughout compressor 34 during operation.

Crankshaft 42 is rotatably driven by an electric motor including stator 41, with windings passing therethrough, and a rotor 44 press-fitted on crankshaft 42. Upper and lower surfaces of rotor 44 have respective upper and lower counterweights 45, 46 thereon. An Oldham coupling (not shown) couples crankshaft 42 to an orbiting scroll member 47 having a spiral vane or wrap 48 on the upper surface thereof. A nonorbiting scroll member 49 is also provided having a wrap 50 positioned in meshing engagement with wrap 48 of orbiting scroll member 47. Nonorbiting scroll member 49 has a center-disposed discharge passage 51 that is in fluid communication with a discharge muffler chamber 52 defined by cap 38 and partition 40. An inlet port 53 on shell 37 allows refrigerant to flow into a suction side or inlet chamber 54.

Compressor 34 also includes numerous sensors, diagnostic modules, printed circuit board assemblies, solenoids, such as internal and external capacity modulation solenoids, switches, such as a switch to change resistance of motor 36 to provide a first resistant for start-up and a second resistance for continuous operation, and other electrically-actuated devices or loads 26. These electrical devices may be internal or external to the compressor and may be stationary or rotating with the rotating components of the compressor.

During operation, motor 36 causes rotor 44 to rotate relative to stator 41, which causes crankshaft 42 to rotate. Rotation of crankshaft 42 causes orbiting scroll member 47 to orbit relative to nonorbiting scroll member 49. Working fluid within suction chamber 54 is pulled into the space between wraps 48, 50 and progresses toward the central portion due to the relative movement therebetween.

Pressurized working fluid is discharged from scroll members 47, 49 through discharge passage 51 and flows into discharge chamber 52. The working fluid within discharge chamber 52 is at a relatively high temperature and pressure. Compressed high-temperature, high-pressure working fluid flows from discharge chamber 52 through discharge passage 39 and onto the other components of the vapor-compression circuit within which compressor 34 is employed.

During operation, waste heat $Q_{waste}$ is generated throughout compressor 34. This waste heat $Q_{waste}$ may be conducted to a thermoelectric device 20. Waste heat $Q_{waste}$ may be generated by rotor 44, which gets hot when rotated and is cooled by the internally distributed lubricant and the working fluid (suction gas) within suction chamber 54. The heat flow from rotor 44 to the lubricant and/or suction side working fluid represents a source of waste heat $Q_{waste}$ that may be conducted to a thermoelectric device 20.

As shown in FIG. 5, a TEM 33a, which may be attached to rotor 44, includes a thermoelectric device 20a with hot side 22a. Hot side 22a is in heat-transferring relation to rotor 44 while cold side 24a is in heat-transferring relation with the lubricant and working fluid within suction chamber 54. The temperature differential between the hot and cold sides 22a, 24a causes a heat $Q_a$ to flow through TEM 33a, which generates an electric current that is supplied to a load 26a. Attached to moving rotor 44, TEM 33a powers load 26a that is also rotating with rotor 44 or shaft 42. For example, load 26a may include a resistance switch that changes the resistance of the rotor so that a higher resistance is realized for a startup and a lower resistance is realized during nominal operation, a temperature sensor, an RPM sensor, and the like. While TEM 33a is shown as being attached to the upper portion of rotor 44, it should be appreciated that TEM 33a can be attached to other portions of rotor 44, such as a middle, lower or internal portion, made integral with upper or lower counterweight 45, 46, or in direct contact with lubricant within sump 43.

Partition 40, which separates the relatively hot discharge gas within discharge chamber 52 from the relatively cooler suction gas within suction chamber 54, conducts waste heat $Q_{waste}$, which may be used to generate electrical power within a thermoelectric device 20. By attaching a TEM 33b to partition 40 with hot thermal conductor 30b in heat-transferring relation with partition 40 and cold thermal conductor 32b in heat-transferring relation with the suction gas within suction chamber 54, waste heat $Q_b$ may be transferred from partition 40 through TEM 33b and into the suction gas within suction chamber 54. Waste heat $Q_b$ generates an electric current in thermoelectric device 20b of TEM 33b. TEM 33b may be connected to an internal electric load 26b, or an external electric load $26b_2$. TEM 33b may be attached in a fixed manner to a stationary component, such as partition 40, which facilitates the attachment to stationary loads either internal or external to compressor 34. By positioning thermoelectric device 20 in heat-transferring relation with a stationary component conducting waste heat $Q_{waste}$, an electric current to power a load 26 either internal or external to compressor 34 may be generated.

Waste heat $Q_{waste}$ from the relatively hot discharge gas within discharge chamber 52 is conducted through cap 38 to the ambient environment within which compressor 34 is located. A TEM 33c may be attached to cap 38 with a hot thermal conductor 30c in heat-transferring relation with the exterior surface of cap 38 and the cold thermal conductor 32c in heat-transferring relation with the ambient environment. As shown in FIG. 5, cold thermal conductor 32c includes fins over which the ambient air flows and hot thermal conductor 30c includes a contoured surface matched to the exterior contour of cap 38. Hot thermal conductor 30c has a greater surface area in contact with cap 38 than in contact with hot side 22c of thermoelectric device 20c. The temperature differential between the ambient air and cap 38 causes waste heat $Q_c$ to flow through TEM 33c and generate an electric current that powers load 26c, which may be external ($26c_1$) or internal ($26c_2$) to compressor 34. Thermoelectric device 20 may be placed in heat-transferring relation to the relatively hot discharge gas in discharge chamber 52 (via cap 38) and the relatively cold ambient environment to provide a temperature gradient that may be used to generate electric current to power a load.

Because of the temperature differential between discharge gas within discharge passage 39 and the ambient environment, a TEM 33d attached to discharge passage 39 with the hot thermal conductor 30d in heat-transferring relation to discharge passage 39 and the cold thermal conductor 32d in heat-transferring relation to the ambient environment causes heat $Q_d$ to flow through TEM 33d. The thermoelectric device 20d of TEM 33d generates electric current that may be used to power load 26d. Thus, a thermoelectric device 20 may be disposed in heat-transferring relation to the relatively hot gas within the discharge passage and the ambient environment to generate an electric current that can be used to power a load.

During the compressing of the refrigerant between wraps 48, 50 of orbiting and non-orbiting scroll members 47, 49, the temperature and pressure of the working fluid increases as it approach central discharge passage 51. As a result, the temperature differential between the relatively cool suction gas on one side of orbiting scroll member 47 and the relatively hot discharge gas near discharge passage 51 generates waste heat $Q_e$. A TEM 33e may be attached to orbiting-scroll member 47 adjacent or opposite to discharge passage 51. Specifically, hot thermal conductor 30e of TEM 33e is placed in heat-transferring relation to a bottom surface of orbiting scroll member 47 generally opposite discharge passage 51. Cold thermal conductor 32e of TEM 33e is disposed in heat-transferring relation to the suction gas and lubricant flowing within suction chamber 54. As waste heat $Q_e$ flows through TEM 33e, the thermoelectric device 20e of TEM 33e generates electric current that may be used to power load 26e. Thus, a thermoelectric device 20 may be disposed in heat-transferring relation to the discharge gas and suction gas adjacent the orbiting scroll member to generate electric current that can be used to power a load.

During operation, stator 41 generates waste heat $Q_f$ that is transferred to the internally distributed lubricant and/or suction gas in the suction chamber 54. A TEM 33f may be attached to stator 41 with the hot thermal conductor 30f in heat-transferring relation to stator 41 and cold thermal conductor 32f is in heat-transferring relation to the lubricant and/or suction gas in suction chamber 54. The temperature differential between stator 41 and the lubricant and/or suction gas within suction chamber 54 causes waste heat $Q_f$ to flow through TEM 33f, wherein thermoelectric device 20f generates electric current that may be used to power load 26f. While TEM 33f is shown as being attached to the upper portion of stator 41, it should be appreciated that TEM 33f can be attached to other portions of stator 41, such as a middle, lower or internal portion, or in direct contact with lubricant within sump 43. Thus, a thermoelectric device may be disposed in heat-transferring relation to the stator and the lubricant or suction gas to generate electric current that can be used to power a load.

The lubricant within sump 43 of compressor 34 is relatively hot (relative to the ambient environment) and heat waste $Q_g$ is conducted from the lubricant through shell 37 to the ambient environment. A TEM 33g may be positioned with cold thermal conductor 32g in heat-transferring relation to the ambient environment and hot thermal conductor 30g in heat-transferring relation to the lubricant within sump 43. This may be accomplished by integrating TEM 33g within the wall of shell 37. The temperature differential between the lubricant and ambient causes waste heat $Q_g$ to flow through thermoelectric device 20g in TEM 33g and generate electric current that may be used to power load 26g. Thus, a thermoelectric device 20 disposed in heat-transferring relation to the relatively hot lubricant and relatively cool ambient environment may be used to generate electric current to power a load.

Figure 6:
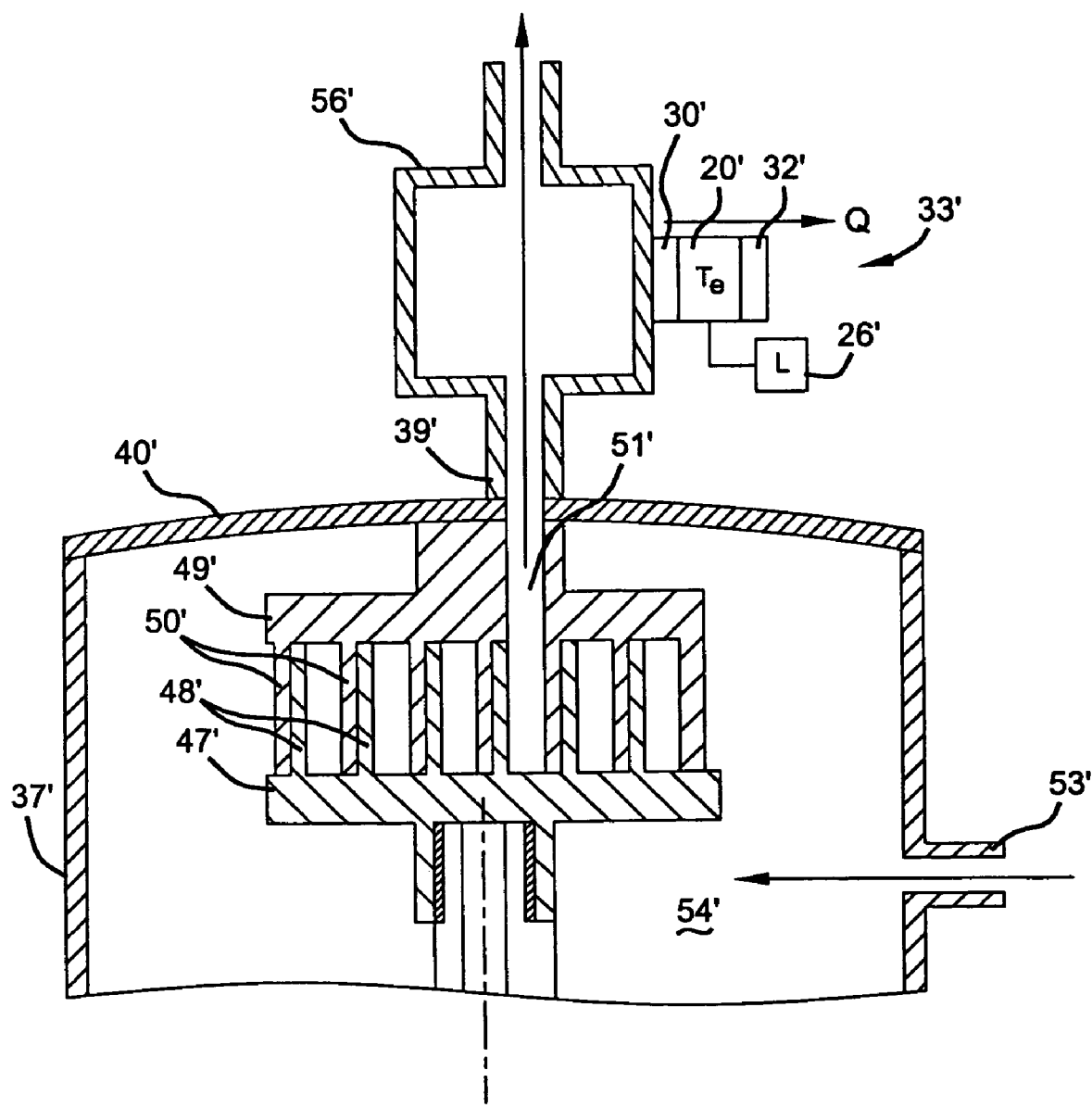
FIG. 6 is a schematic diagram of a top portion of another compressor with a thermoelectric device according to the present teachings.

Referring to FIG. 6, a partial schematic view of a top portion of another exemplary compressor, in this case an orbital scroll compressor 34' having a direct discharge by way of non-limiting example is shown. Compressor 34' is similar to compressor 34 discussed above with reference to FIG. 5. In compressor 34', however, discharge passage 39' communicates directly with discharge passage 51' of non-orbiting scroll member 49' such that the compressed working fluid (discharge gas) flows directly into discharge passage 39' from discharge passage 51'. A muffler 56' is attached to discharge passage 39'. The relatively hot compressed working fluid flows through muffler 56'. Waste heat $Q_{waste}$ from the relatively hot discharge gas within muffler 56' is conducted through the walls of muffler 56' to the ambient environment within which compressor 34' is located. A TEM 33' may be attached to muffler 56' with hot thermal conductor 30' in heat-transferring relation with the exterior surface of muffler 56' and cold thermal conductor 32' in heat-transferring relation with the ambient environment. Cold thermal conductor 32' may include fins over which the ambient air flows and hot thermal conductor 30' may include a contoured surface matched to the exterior contour of muffler 56' to facilitate heat transfer. The temperature differential between the ambient air and muffler 56' causes waste heat Q to flow through TEM 33' and generate an electric current that powers load 26'. Thus, thermoelectric device 20' may be placed in heat-transferring relation to the relatively hot discharge gas in muffler 56' (via the exterior surface of muffler 56') and the relatively cold ambient environment to provide a temperature gradient that may be used to generate electric current to power a load.

Figure 7:
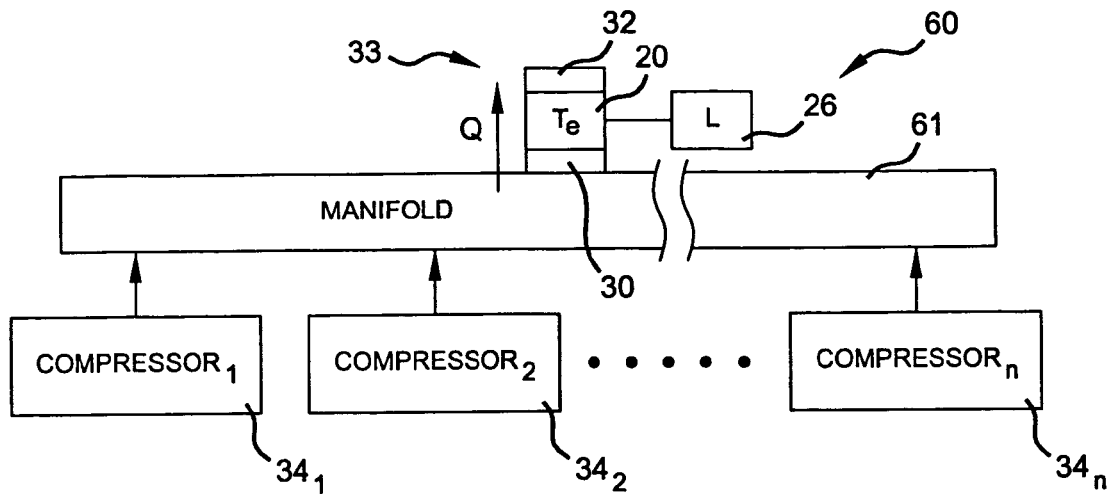
FIG. 7 is a schematic diagram of a bank of compressors and a thermoelectric device according to the present teachings.

Referring to FIG. 7, a multi-compressor system 60 including compressors $34_1$-$34_n$ are arranged in parallel with the relatively hot, high-pressure discharge gas from each compressor 34 flowing into a common discharge manifold 61 is shown. The temperature differential between the discharge gas and ambient causes waste heat Q to flow from the discharge gas to the ambient environment through manifold 61. Positioning a TEM 33 adjacent discharge manifold 61 with a hot thermal conductor 30 in heat-transferring relation to discharge manifold 61 and cold thermal conductor 32 in heat-transferring relation to the ambient air about discharge manifold 61 may generate electric current from waste heat Q flowing through thermoelectric device 20 within TEM 33. The electric current may be used to power load 26. Thus, in a multi-compressor system having a common discharge manifold, a thermoelectric device may be positioned between the relatively hot discharge gas in the manifold and the ambient environment to generate an electric current from the waste heat Q to power a load 26.

Figure 8:
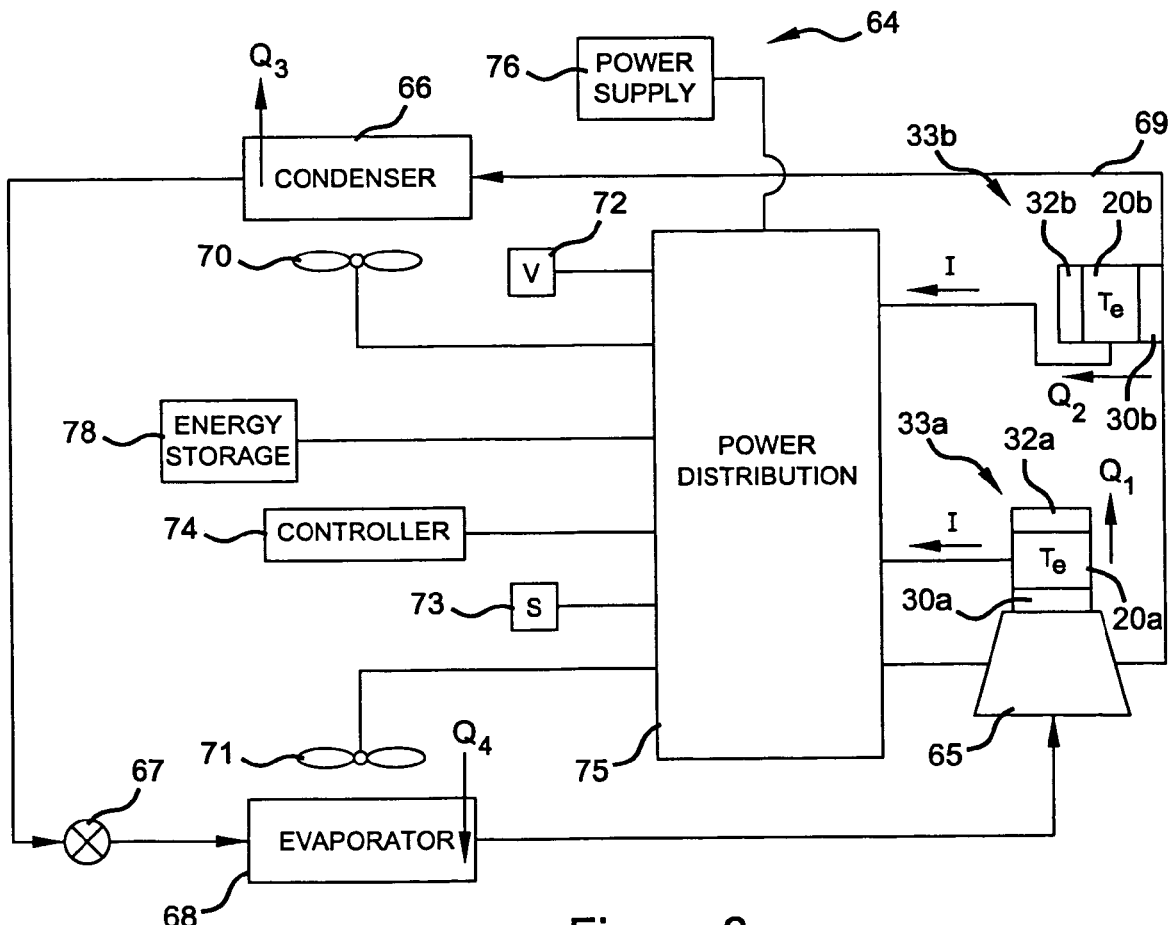
FIG. 8 is a schematic diagram of a refrigeration system according to the present teachings.

Referring to FIG. 8, an exemplary refrigeration system 64 includes a compressor 65, a condenser 66, an expansion device 67 and an evaporator 68 all connected together to thereby form a vapor-compression circuit 69. Condenser 66 transfers a heat $Q_3$ from the relatively hot working fluid flowing therethrough to an airflow flowing there across and condenses the working fluid. Evaporator 68 is operable to extract a heat flow $Q_4$ from an airflow flowing there across and transfer it to the relatively cool and expanded working fluid flowing therethrough.

Refrigeration system 64 includes various loads 26 that require electricity to operate. Loads 26 may include electrically driven fans 70, 71 which push air across condenser 66 and evaporator 68, respectively, various valves, solenoids or actuators 72 and various sensors 73. Additionally, load 26 may include a controller 74, which may be used to control or communicate with valves 72, sensors 73, compressor 65, fans 70, 71 and other components of refrigeration system 64. The various power requirements of refrigeration system 64 may be met by a power distribution member 75 which supplies current to power the various loads 26 of refrigeration system 64.

The power demands of the various loads 26 may be provided by a power supply 76, which may provide both AC current and DC current, through power-distribution block 75. The electric current may be supplied by individual connections directly to power supply 76, through one or more power distribution devices, and/or through controller 74.

Waste heat $Q_{waste}$ generated by refrigeration system 64 may be conducted to one or more thermoelectric devices 20 to generated electric current supplied to load 26. As shown in FIG. 8, a TEM 33a may capture waste heat $Q_1$, from compressor 65 and generate current I supplied to power-distribution block 75. Additionally, TEM 33b may extract waste heat $Q_2$ from the relatively high-temperature working fluid flowing through vapor-compression circuit 69, particularly compressed working fluid that has not been condensed, and generate current I supplied to power-distribution block 75.

During startup of refrigeration system 64, a TEM 33 will not produce power to supply load 26. Rather, during startup, power may be supplied by power supply 76. Once refrigeration system 64 reaches steady state (nominal) operation, waste heat $Q_{waste}$ will be generated and TEM 33 may produce electric current.

As the electric current production by one or more TEM 33 increases, the use of power supply 76 may be reduced. Power demands of load 26 may be partially or fully met by the electric current generated by one or more TEM 33, which may also supply current to power one or more low-power-consuming components while power supply 76 supplies current to meet the power demand of high-power-consuming components, such as compressor 65.

An energy-storage device 78 may provide temporary startup power to one or more components of refrigeration system 64. Energy-storage devices, such as rechargeable batteries, ultra capacitors, and the like, may store a sufficient quantity of power to meet the requirements, particularly at system startup, of some or all of the components of refrigeration system 64 up until the time TEM 33 is able to produce sufficient current to power those components. Excess current generated by TEM 33 may be utilized to recharge energy-storage device 78 for a subsequent startup operation. Thus, energy storage device 78 may be part of load 26.

In refrigeration system 64, thermoelectric devices 20 may use waste heat $Q_{waste}$ to generate electric current that can power various components of refrigeration system 64. The electric current supplied by thermoelectric devices may be used to supplement electric current from power supply 76 and/or meet the demand of the refrigeration system. Additionally, an energy-storage device 78 may provide the initial startup power requirements of refrigeration system 64 until one or more thermoelectric devices 20 are able to replace the electrical power supplied by energy-storage device 78.

Figure 9:
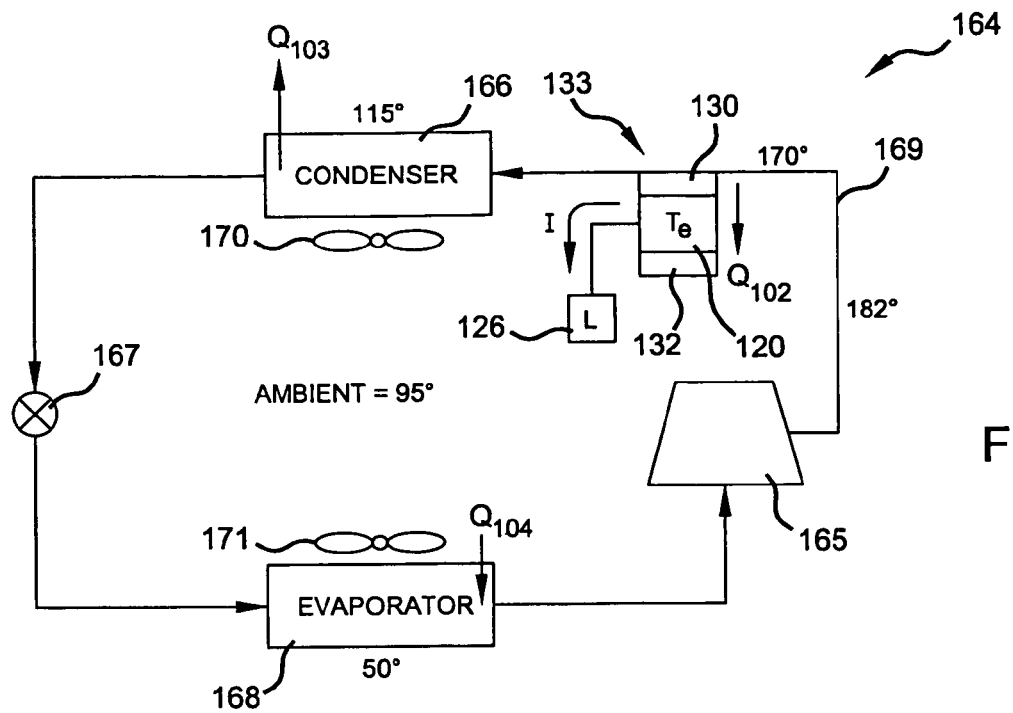
FIG. 9 is a schematic diagram of a refrigeration system according to the present teachings.

Referring now to FIG. 9, a refrigeration system 164 includes a vapor-compression circuit 169 and TEM 133. TEM 133, which produces an electric current I to power a load 126, may extract heat $Q_{102}$ from the relatively high-temperature, non-condensed working fluid flowing through vapor-compression circuit 169 between compressor 165 and condenser 166, thereby de-superheating the working fluid flowing into condenser 166.

Working fluid may exit compressor 165 at, by way of non-limiting example, 182° F. and arrive at TEM 133 at about 170° F. If the ambient environment is at say 95° F., a 75° F. temperature differential across TEM 133 produces waste heat $Q_{102}$ to flow from the working fluid to the ambient through TEM 133, which reduces the temperature of the working fluid prior to flowing into condenser 166. Because the heat $Q_{103}$ required to be extracted by condenser 166 to meet the needs of evaporator 168 is reduced, compressor 165 may operate more efficiently or at a lower capacity or at a lower temperature, such as by way of non-limiting example 115° F. Thermoelectric device 20 may power load 126 while de-superheating non-condensed working fluid thereby meeting part of all of the power demand and increasing the efficiency of the system. De-superheating the working fluid enables condenser 166 to operate more efficiently or be sized smaller than what would be required if no de-superheating were to occur, further helping thermoelectric device meet system power requirements.

Figure 10:
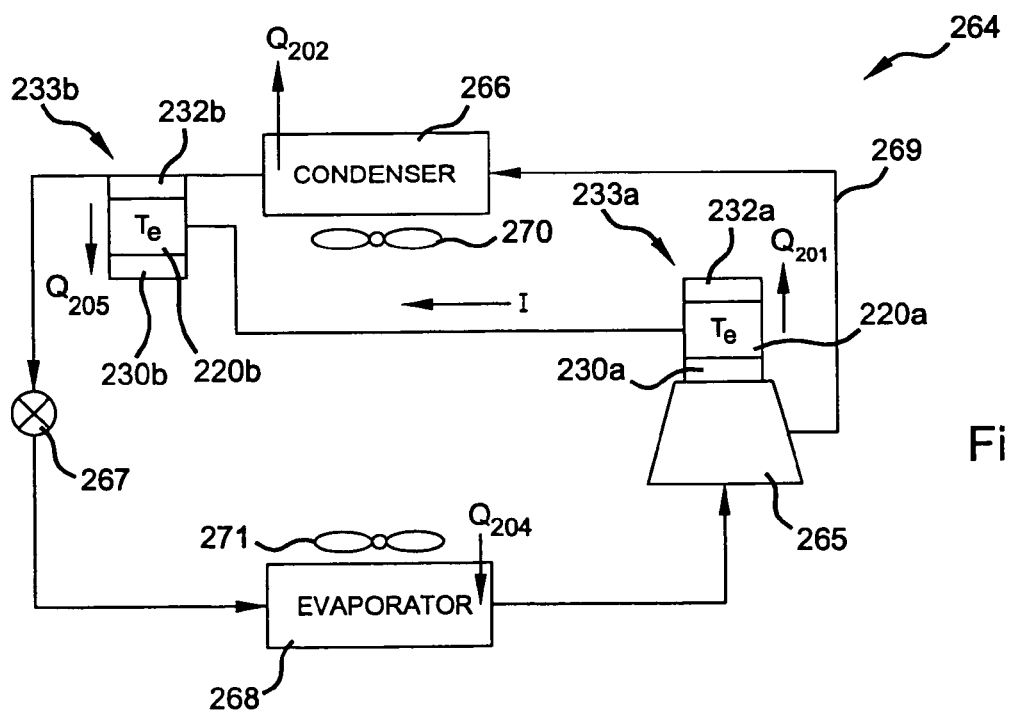
FIG. 10 is a schematic diagram of a refrigeration system according to the present teachings.

Referring to FIG. 10, a refrigeration system 264 includes a pair of thermoelectric modules 233a, 233b for subcooling the condensed working fluid exiting condenser 266. First thermoelectric module 233a extracts waste heat $Q_{201}$ from compressor 265 and generates an electric current I that is supplied to second thermoelectric module 233b, which is in heat-transferring relation to vapor-compression circuit 269. The current supplied by first TEM 233a drives the temperature gradient across second TEM 233b to allow the removal of heat $Q_{205}$ from condensed working fluid in vapor-compression circuit 269. Cold side 224b of thermoelectric device 220b is in heat-transferring relation to the condensed working fluid within vapor-compression circuit 269 exiting condenser 266, where heat $Q_{205}$ is extracted from the condensed working fluid and transferred to the ambient. To enhance the removal of heat $Q_{205}$ from the condensed working fluid to the ambient environment, the flow of air caused by fan 270 may be directed over hot thermal conductor 230b of second TEM 233b.

Second TEM 233b may remove heat $Q_{205}$ to sub-cool the condensed working fluid therein and increase the cooling capacity of refrigeration system 264. Condenser 266 may reduce the working fluid temperature to approximately ambient temperature and second thermoelectric module 233b may further cool the condensed working fluid to below-ambient temperature by extracting heat $Q_{205}$ therefrom. The lower-temperature condensed working fluid provides a larger cooling capacity for evaporator 268, which can extract a larger quantity of heat $Q_{204}$ from the air flowing across evaporator 268, thus achieving a greater cooling capacity.

Figure 11:
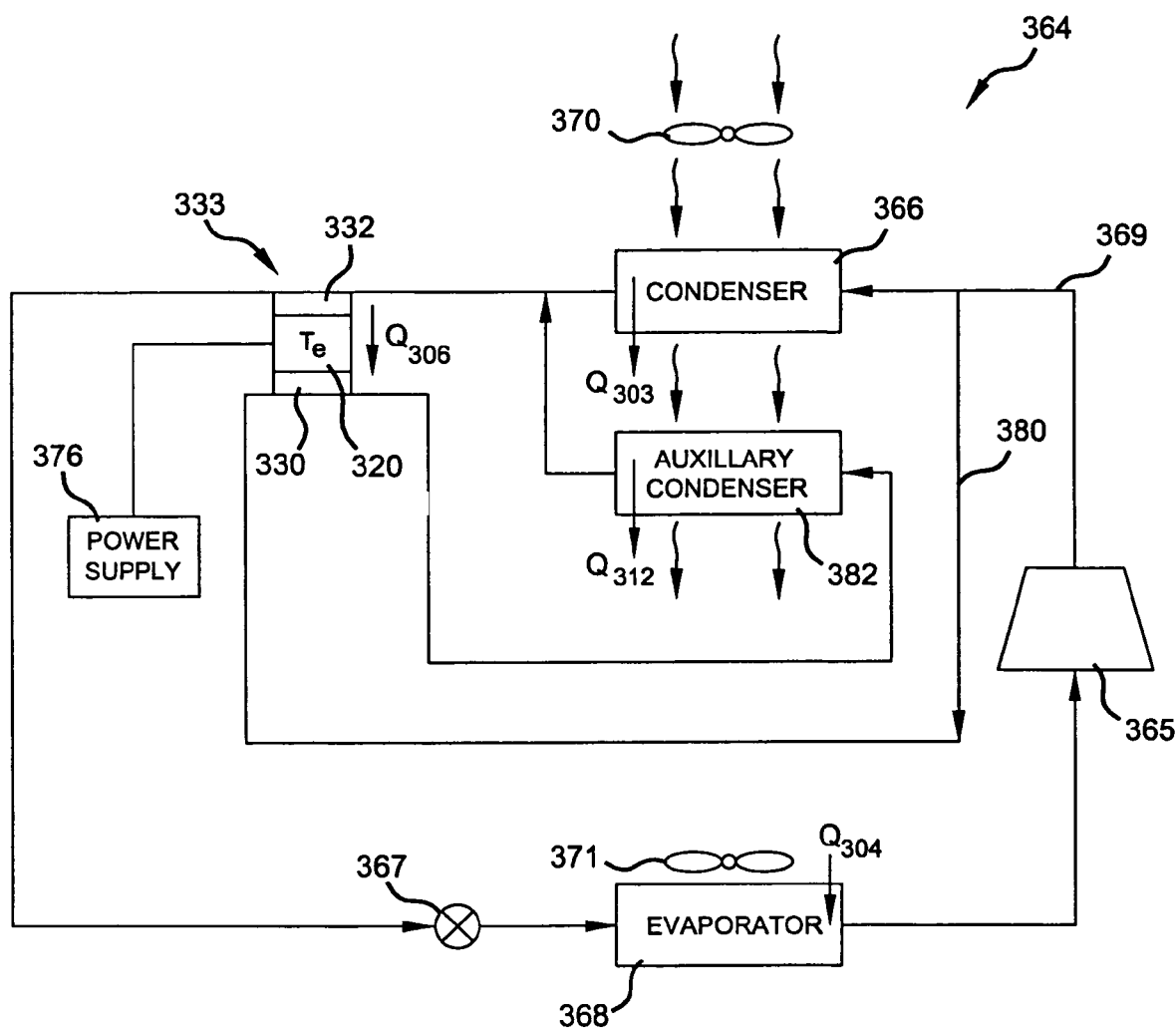
FIGS. 11-13 are schematic diagrams of heat pump systems according to the present teachings.

Referring to FIG. 11, a refrigeration system 364 operated as a heat pump is shown. In this system, a thermoelectric module 333 is utilized to supplement the heating capacity of refrigeration system 364. Hot thermal conductor 330 of TEM 333 is in heat-transferring relation with a portion of the relatively high-temperature, high-pressure working fluid exiting compressor 365 and flowing through an auxiliary flow path 380. Cold thermal conductor 332 of TEM 333 is in heat-transferring relation with the condensed working fluid exiting condenser 366. Power supply 376 selectively supplies electric current to TEM 333 thereby forming a temperature gradient across TEM 333 which extracts heat $Q_{306}$ from the condensed working fluid and transfers the heat $Q_{306}$ to the portion of the relatively high-temperature, high-pressure working fluid flowing through auxiliary flow path 380, further increasing the temperature of the working fluid.

This higher-temperature working fluid is directed through an auxiliary condenser 382 to supplement the heat transfer to the air flowing over condenser 366. The air flow generated by fan 370 flows over condenser 366 then auxiliary condenser 382. Auxiliary condenser 382 transfers heat $Q_{312}$ from the higher-temperature working fluid flowing therethrough to the air flowing thereacross, thereby increasing the temperature of the air flow and providing additional heat transfer to the air flow.

The condensed working fluid exiting auxiliary condenser 382 joins with the condensed working fluid exiting condenser 366 prior to flowing past TEM 333. The condensed working fluid flows through expansion device 367 and evaporator 368 wherein heat $Q_{304}$ is extracted from the air flowing thereacross. Accordingly, a thermoelectric device in refrigeration system 364 transfers heat to a portion of the relatively high-temperature, high-pressure working fluid exiting the compressor which is subsequently transferred to an air flow flowing across an auxiliary condenser, thereby supplementing the overall heat transferred to the air flow. The electric current supplied to the thermoelectric device is modulated to provide varying levels of supplementation of the heat $Q_{312}$ transferred to the air flowing over the condenser and the auxiliary condenser.

Figure 12:
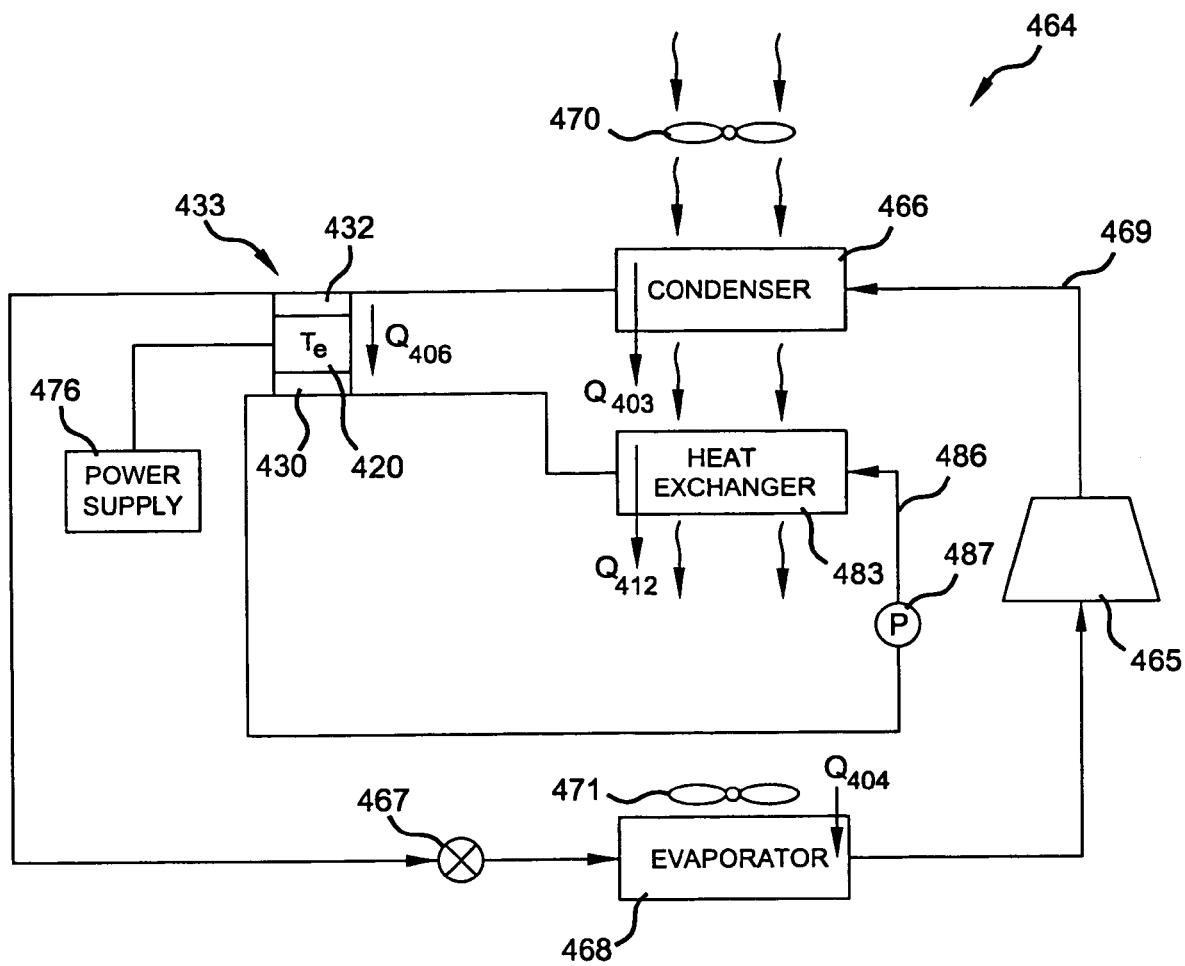

Referring to FIG. 12, a refrigeration system 464 operated as a heat pump is shown. In refrigeration system 464, a thermoelectric module 433 selectively transfers heat to a single-phase fluid flowing through a single-phase, heat-transfer circuit 486 which supplements the heating capacity of refrigeration system 464. Heat-transfer circuit 486 includes a pump 487 and a heat exchanger 483 arranged adjacent condenser 466 such that air flow generated by fan 470 flows across both condenser 466 and heat exchanger 483.

Cold thermal conductor 432 is in heat-transferring relation with the condensed working fluid exiting condenser 466 which extracts heat $Q_{406}$ therefrom. Hot thermal conductor 430 is in heat-transferring relation with the single-phase fluid flowing through heat-transfer circuit 486 and transfers heat $Q_{406}$ thereto. Power supply 476 modulates the current flowing to thermoelectric device 420 within TEM 433 to generate and maintain a desired temperature gradient thereacross, thereby resulting in a desired quantity of heat $Q_{406}$ transferred to the single-phase fluid and increasing the temperature of the single-phase fluid to a desired temperature. Pump 487 pumps the single-phase fluid through heat exchanger 483 which transfers heat $Q_{412}$ from the single-phase fluid to the air flowing thereacross, which raises the temperature of the air flow. A variety of single-phase fluids can be utilized within heat-transfer circuit 486. By way of non-limiting example, the single-phase fluid may be a potassium formate or other types of secondary heat transfer fluids, such as those available from Environmental Process Systems Limited of Cambridgeshire, UK and sold under the Tyfo® brand, and the like. In refrigeration system 464, a thermoelectric device transfers heat $Q_{406}$ from the condensed working fluid exiting the condenser to a single-phase fluid flowing through a heat-transfer circuit which transfers heat $Q_{412}$ to the air flowing across heat exchanger 483.

Figure 13:
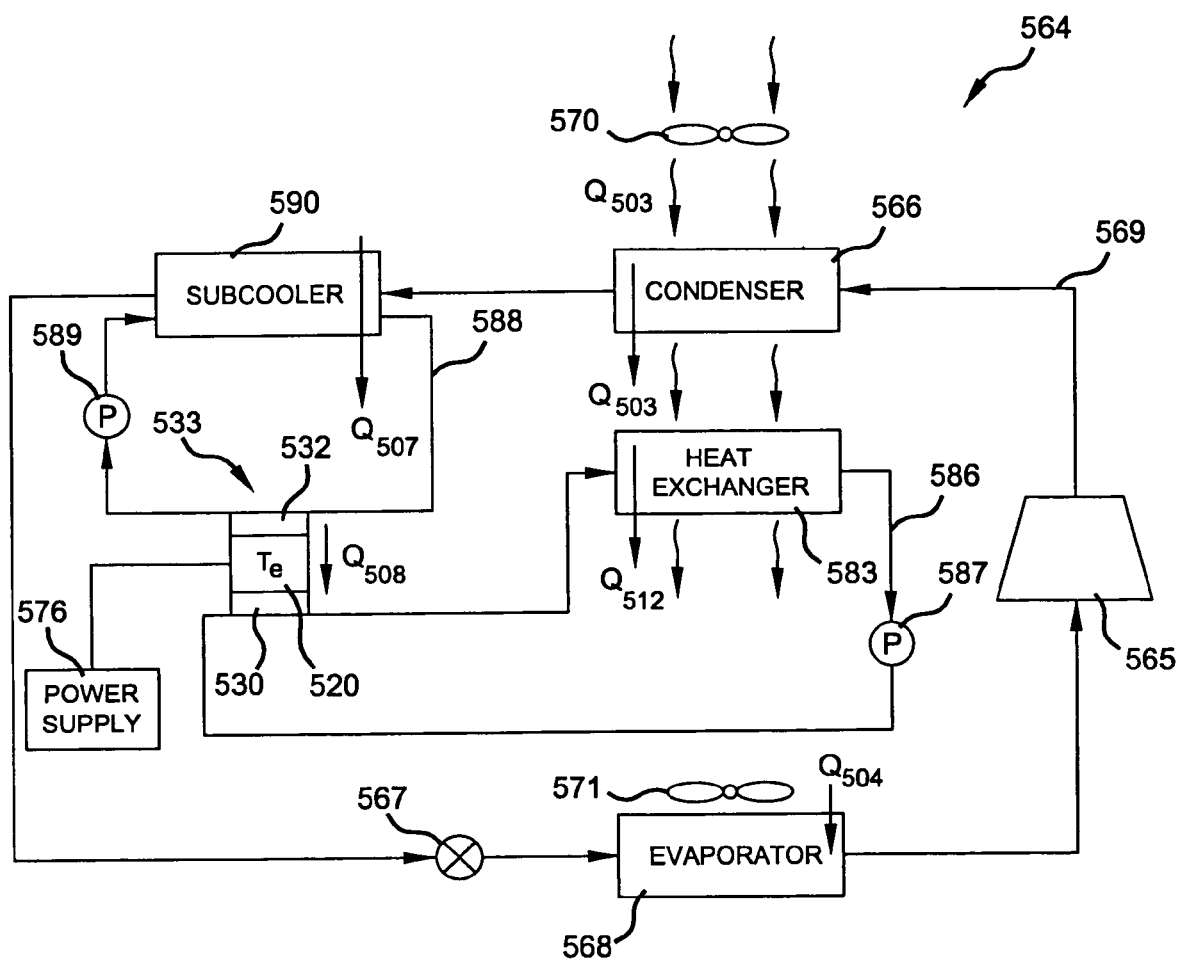

Referring to FIG. 13, a refrigeration system 564 operated as a heat pump is shown. Refrigeration system 564 is similar to refrigeration system 464 with the addition of a second single-phase, heat-transfer circuit 588. Second heat-transfer circuit 588 includes a pump 589 and a subcooler 590. Subcooler 590 is in heat-transferring relation with condensed working fluid exiting condenser 566 and the single-phase fluid flowing through heat-transfer circuit 588. Subcooler 590 transfers heat $Q_{507}$ from the condensed working fluid flowing therethrough to the single-phase fluid flowing therethrough, which increases the temperature of the single-phase fluid.

Cold thermal conductor 532 of TEM 533 is in heat-transferring relation with the single-phase fluid flowing through heat-transfer circuit 588. Hot thermal conductor 530 of TEM 533 is in heat-transferring relation with the single-phase fluid flowing through heat-transfer circuit 586. Power supply 576 modulates the current flowing to thermoelectric device 520 to maintain a desired temperature differential thereacross which transfers heat $Q_{508}$ from the single-phase fluid within heat-transfer circuit 588 to the single-phase fluid in heat-transfer circuit 586 through thermoelectric device 520. Heat $Q_{508}$ increases the temperature of the single-phase fluid flowing through heat-transfer circuit 586. Heat $Q_{512}$ is transferred from the single-phase fluid flowing through heat-transfer circuit 586 to the air flowing across heat exchanger 583, thereby increasing the temperature of the air flow. Refrigeration system 564 uses two single-phase fluid heat-transfer circuits 586, 588 in heat-transferring relation to one another through thermoelectric device 520 to supplement the heating of the air flow flowing across condenser 566.

Figure 14:
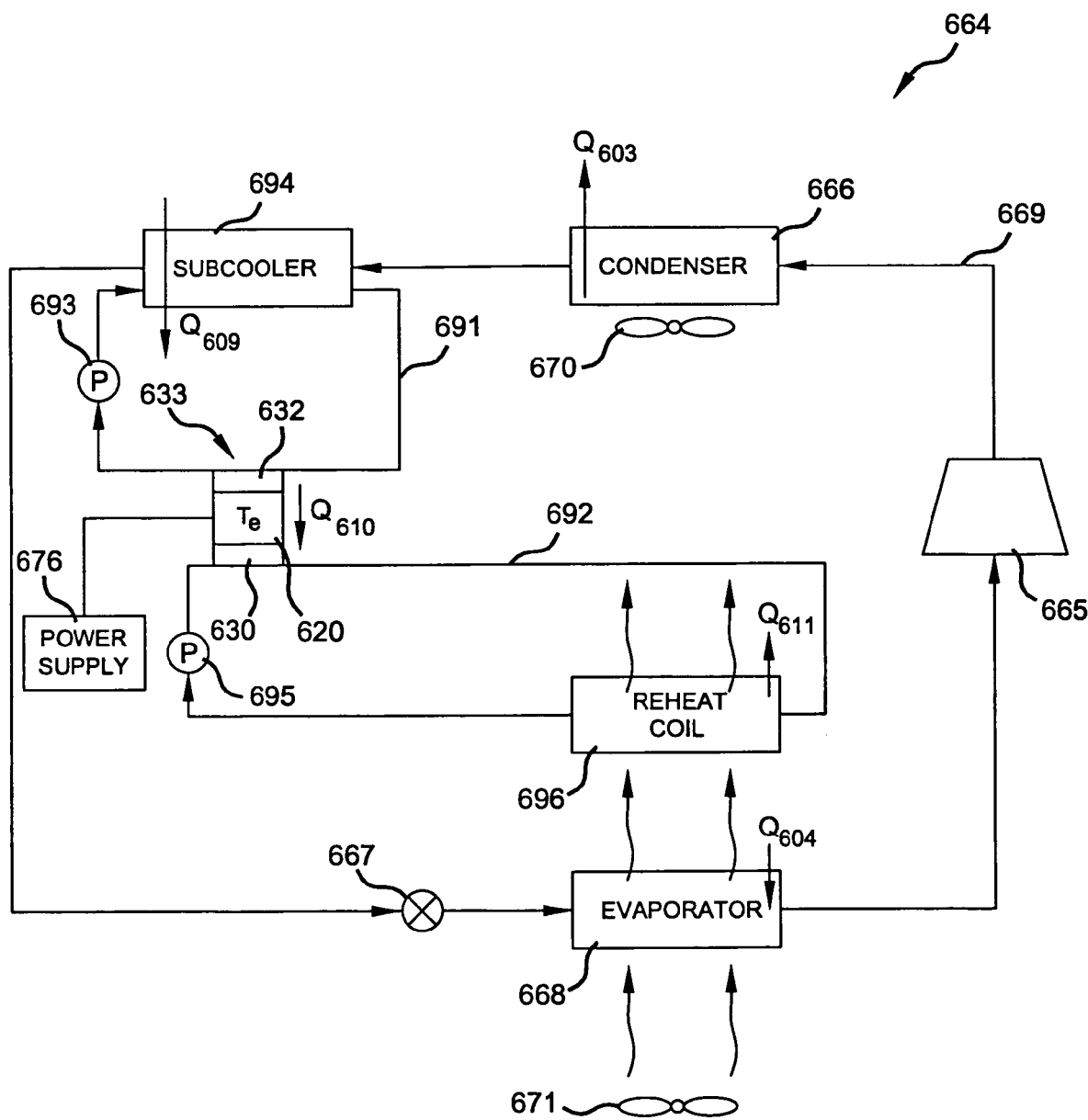
FIG. 14 is a schematic diagram of a refrigeration system according to the present teachings.

Referring to FIG. 14, a refrigeration system 664 providing a dehumidification and reheating of the cooling air provided thereby is shown. Refrigeration system 664 includes vapor-compression circuit 669 having a working fluid flowing therethrough. Evaporator 668 is operated at a very low temperature and extracts heat $Q_{604}$ from the air flow flowing thereacross which lowers the humidity and temperature of the air flow. First and second heat-transfer circuits 691, 692 in heat-transferring relation through TEM 633 transfer heat to the air flow to raise the temperature thereby making the air flow suitable for its intended application.

First heat-transfer circuit 691 includes a pump 693 and a subcooler 694 and has a single-phase fluid flowing therethrough. Subcooler 694 transfers heat $Q_{609}$ from the condensed working fluid exiting condenser 666 to the single-phase fluid flowing through first heat-transfer circuit 691 which increases the temperature of the single-phase fluid. Cold thermal conductor 632 is in heat-transferring relation with the single-phase fluid flowing through first heat-transfer circuit 691 while hot thermal conductor 630 is in heat-transferring relation with the single-phase fluid flowing through second heat transfer circuit 692. Power supply 676 modulates the current flowing to thermoelectric device 620 in TEM 633 to maintain a desired temperature gradient thereacross and transfer heat $Q_{610}$ from the single-phase fluid flowing through first heat-transfer circuit 691 to the single-phase fluid flowing through second heat-transfer circuit 692 through thermoelectric device 620.

Heat $Q_{610}$ increases the temperature of the single-phase fluid flowing through second heat-transfer circuit 692. A pump 695 pumps the single-phase fluid in second heat-transfer circuit 692 through a reheat coil 696. The air flow induced by fan 671 flows across both evaporator 668 and reheat coil 696. Reheat coil 696 transfers heat $Q_{611}$ from the single-phase fluid flowing therethrough to the air flow flowing thereacross. Heat $Q_{611}$ increases the temperature of the air flow without increasing the humidity. Refrigeration system 664 utilizes two single-phase heat transfer circuits 691, 692 in heat-transferring relation therebetween with a thermoelectric device to reheat an air flow dehumidified and chilled by the evaporator of the vapor compression circuit.

While the present teachings have been described with reference to the drawings and examples, changes may be made without deviating from the spirit and scope of the present teachings. It should be appreciated that the orbiting scroll compressors shown in FIGS. 5 and 6 are by way of a non-limiting example and may not show all of the components therein. Orbital scroll compressors are shown and described in greater detail in U.S. Pat. No. 6,264,446 entitled "Horizontal Scroll Compressor"; U.S. Pat. No. 6,439,867 entitled "Scroll Compressor Having a Clearance for the Oldham Coupling"; U.S. Pat. No. 6,655,172 entitled "Scroll Compressor with Vapor Injection"; U.S. Pat. No. 6,679,683 entitled "Dual Volume-Ratio Scroll Machine" and U.S. Pat. No. 6,821,092 entitled "Capacity Modulated Scroll Compressor", all assigned to the assignee of the present invention and incorporated by reference herein. Other types of compressors generate waste heat that can be utilized with one or more thermoelectric devices to generate a current flow that can be used elsewhere. For example, the compressors can be either internally or externally-driven compressors and may include rotary compressors, screw compressors, centrifugal compressors, and the like. Moreover, while TEM 33g is shown as being integrated in the wall of shell 37, it should be appreciated that TEMs may be integrated into other components, if desired, to be in direct contact with a heat source or heat sink. Furthermore, while the condensers and evaporators are described as being coil units, it should be appreciated that other types of evaporators and condensers may be employed. Additionally, while the present teachings have been described with reference to specific temperatures, it should be appreciated that these temperatures are provided as non-limiting examples of the capabilities of the refrigeration systems. Accordingly, the temperatures of the various components within the various refrigeration systems may vary from those shown.

Furthermore, it should be appreciated that additional valves, sensors, control devices and the like can be employed, as desired, in the refrigeration systems shown. Moreover, thermal insulation may be utilized to promote a directional heat transfer so that desired hot and cold sides for the thermoelectric device are realized. Accordingly, the description is merely exemplary in nature and variations are not to be regarded as a departure from the spirit and scope of the teachings.

What is claimed is:

1. A method comprising:
    transferring heat from a source of waste heat associated with a compressor through a thermoelectric device to suction gas;
    generating an electric current from said transferring;
    powering a load with said electric current.

2. The method of claim 1, wherein said suction gas is a relatively cold working fluid and said transferring includes transferring heat from a relatively hot working fluid in said compressor to said relatively cold working fluid in said compressor through a component in said compressor that separates said relatively hot working fluid from said relatively cold working fluid.

3. The method of claim 2, wherein said transferring includes transferring heat through a compressing member in heat-transferring relation to both said relatively hot and relatively cold working fluids and through said thermoelectric device.

4. The method of claim 3, wherein said compressing member is one of an orbiting scroll member and a nonorbiting scroll member.

5. The method of claim 2, wherein said transferring includes transferring heat through a partition separating said relatively hot working fluid from said relatively cold working fluid and through said thermoelectric device.

6. The method of claim 1, wherein said transferring includes transferring heat from a motor in said compressor.

7. The method of claim 6, wherein said transferring includes transferring heat from a rotor of said motor to at least one of a lubricant and a suction gas in said compressor through said thermoelectric device.

8. The method of claim 6, wherein said transferring includes transferring heat from a stator of said motor to at least, one of a lubricant and a suction gas in said compressor through said thermoelectric device.

9. The method of claim 1, wherein said thermoelectric device is a first thermoelectric device and said load is a second thermoelectric device.

10. The method of claim 9, further comprising subcooling a condensed working fluid exiting a condenser in a vapor-compression circuit with said second thermoelectric device using said electric current generated by said first thermoelectric device.

11. The method of claim 10, wherein subcooling said condensed working fluid includes extracting heat from said condensed working fluid with said second thermoelectric device and transferring said extracted heat to an ambient environment.

12. The method of claim 1, wherein said transferring includes transferring heat from a relatively hot compressed working fluid flowing through a vapor-compression circuit to an ambient environment.

13. The method of claim 12, wherein said transferring includes transferring heat from a relatively hot compressed working fluid within a discharge passage of said compressor to said ambient environment through a wall of said discharge passage and through said thermoelectric device.

14. The method of claim 12, wherein said transferring includes transferring heat from a relatively hot compressed working fluid within said compressor to said ambient environment through a shell of said compressor and through said thermoelectric device.

15. The method of claim 1, wherein said transferring includes transferring heat from a relatively hot working fluid flowing through a vapor-compression circuit to a relatively cold working fluid flowing through said vapor-compression circuit.

16. The method of claim 1, wherein said powering a load includes powering a load within said compressor.

17. The method of claim 1, wherein said powering a load includes providing power to at least one of the following: a power supply, a fan, a sensor, a flow control device, an actuator, a controller, an energy storage device.

18. The method of claim 1, wherein said transferring includes transferring heat from a relatively hot lubricant within said compressor to an ambient environment through said thermoelectric device.

19. The method of claim 1, wherein said transferring includes transferring heat from a compressed working fluid flowing through a muffler positioned external to said compressor to an ambient environment through said thermoelectric device.

20. A vapor compression circuit comprising:
a compressor;
a source of waste heat associated with said compressor;
a thermoelectric device generating an electric current from said heat and transferring said heat to a suction gas;
a load powered with said electric current.

21. The vapor compression circuit of claim 20, wherein said source of waste heat includes a component in said compressor that separates a relatively hot working fluid from a relatively cold working fluid.

22. The vapor compression circuit of claim 21, wherein said thermoelectric device is in heat-transfer relation to a compressing member in heat-transfer relation to both said relatively hot and said relatively cold working fluid.

23. The vapor compression circuit of claim 22, wherein said compressing member is one of an orbiting scroll member and a non-orbiting scroll member.

24. The vapor compression circuit of claim 21, wherein said source of waste heat includes a partition separating said relatively hot working fluid from said relatively cold working fluid and through said thermoelectric device.

25. The vapor compression circuit of claim 20, wherein said source of waste heat includes a motor in said compressor.

26. The vapor compression circuit of claim 25, wherein said thermoelectric device transfers heat from a rotor of said motor to at least one of a lubricant and a suction gas in said compressor.

27. The vapor compression circuit of claim 25, wherein said thermoelectric device transfers heat from a stator of said motor to at least one of a lubricant and a suction gas in said compressor.

28. The vapor compression circuit of claim 20, wherein said load is disposed within said compressor.

29. The vapor compression circuit of claim 20, wherein said load includes at least one of the group comprising: a power supply, a fan, a sensor, a flow control device, an actuator, a controller, an energy storage device.

30. A vapor compression circuit comprising:
a source of waste heat;
a thermoelectric device generating an electric current from said heat;
a load powered with said electric current;
a condenser in communication with a compressor;
wherein said thermoelectric device is a first thermoelectric device and said load is a second thermoelectric device that subcools a condensed working fluid exiting said condenser using said electric current generated by said first thermoelectric device.

31. The vapor compression circuit of claim 30 wherein said second thermoelectric device extracts heat from said condensed working fluid and transfers said extracted heat to the ambient environment.

* * * * *